Aug. 1, 1967 R. S. HENRY 3,334,313
REED OSCILLATOR WITH AMPLITUDE STABILITY
Filed Sept. 21, 1965
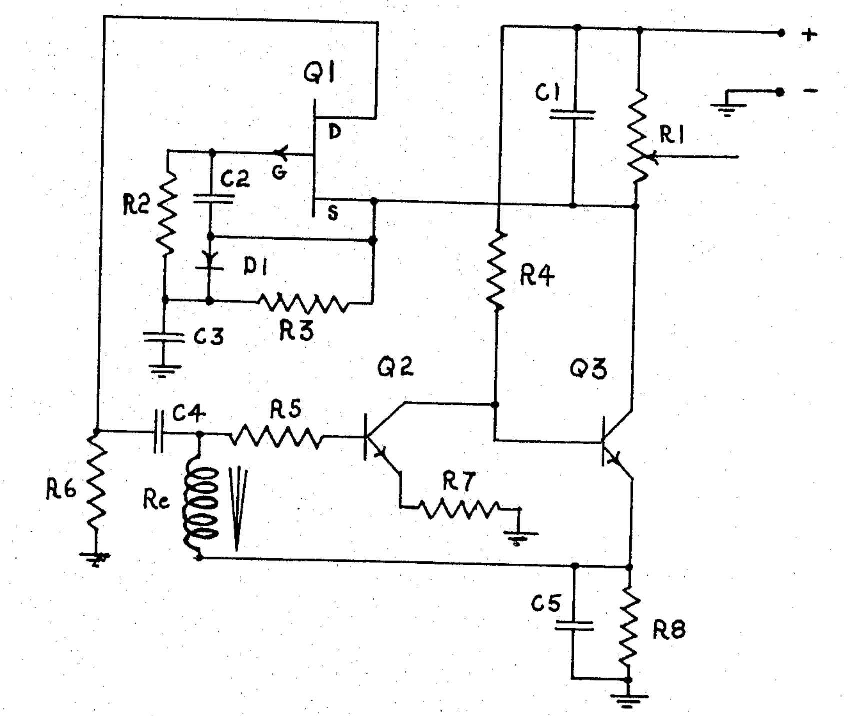
Robert S. Henry

3,334,313
REED OSCILLATOR WITH AMPLITUDE STABILITY

Robert S. Henry, R.D. 1, Box 228A, Troy, N.Y. 12180

Filed Sept. 21, 1965, Ser. No. 488,900
1 Claim. (Cl. 331—116)

This invention relates to apparatus for generating frequency and amplitude stable signals using commercially available single coil, resonant reed frequency controlling elements of either the tuning fork or single tine type.

Some of the applications for such a generator would be in tone controlled squelch circuits, remote control of apparatus by means of tone signals, and as a source of stable audio frequency tone for laboratory use.

One of the basic difficulties of using these reeds as a frequency control device is that the amplitude of reed swing must be held within predetermined limits to provide an oscillator output which is substantially a sine wave, free from non-linear distortion and clipping. If the drive to the reed can be controlled over a wide range of circuit element variables, then the above conditions of controlled reed swing will be met and the oscillator output will be nearly pure sine.

It is the object of this invention to provide an automatic oscillator control which will hold the output of an oscillator at a constant amplitude regardless of the reed frequency or thermal operating conditions. This is done without the use of a manually operated regeneration control, but rather with a high gain and wide dynamic range, automatic gain control circuit.

The figure shows the basic form of the invention using a minimum of parts, but limiting the output voltage from the oscillator to approximately 1 volt.

Referring now to the diagrams, the resonant reed which is portrayed schematically is connected in parallel with the input of a solid state amplifying device consisting of transistors Q2 and Q3 in this instance. This amplifying device need not necessarily have the configuration shown here as long as it has sufficient gain to overcome circuit losses and provide an output which is in phase with its input. It is also desirable to provide a means of setting the gain of the amplifying device to an approximate value, with fixed components.

In one instance this was done by use of a series resistor R5 between the reed and the input of the amplifying device. The output of this amplifying device (collector of Q3) is connected directly to the source of a field effect transistor. It is essential that the A.C. voltage swing at the F.E.T. source be limited to a value which will appear undistorted at the drain. The drain of the field effect transistor is connected through a load resistor R6 to its D.C. supply voltage and through a blocking capacitor C4 back to the resonant reed. Capacitor C1 is connected across the output of the amplifying device to roll off upper frequencies at a 6 db per octave rate and thus force the reed to oscillate at its fundamental rather than its overtone frequencies.

Essentially then we have a field effect transistor being used as a series resistance element between the output of an amplifying device and its input, with a resonant reed at the input of said device.

The full A.C. output voltage of the amplifying device is A.C. connected to the anode of a diode rectifier D1. This same anode is D.C. connected to the source of the field effect transistor. The cathode of said diode is connected through a filter resistor R2 to the gate of the F.E.T. and the gate is maintained at source A.C. potential by being connected to one side of a capacitor C2, while the other side of this capacitor is connected to the source of the F.E.T. The diode has a resistive path across it to act as a diode load because there is a resistor connected from its cathode to the F.E.T. gate R2, and resistor from the F.E.T. gate to the F.E.T source R3 and the F.E.T. source is connected directly to the diode anode. The diode cathode is held at A.C. ground potential by being bypassed to same with a capacitor C3.

A detailed analysis of the basic circuit in the figure is as follows:

When power is first applied to the circuit, the amplifier in this case Q2 and Q3 are activated and any small change of status (such as the current surge at switch closure or transistor noise) at the input to the amplifier (base of Q2) will be amplified and be seen in phase at the output of same (collector of Q3). This change in status is conducted through the silicon of Q1 and appears at its drain across load resistor R6 because the source is coupled to the amplifier output and the drain is connected to R6. C4 passes this amplified status change on to the resonant reed causing the reed to deflect in its magnetic field. The deflection of the reed causes an induced voltage across the reed coil which aids in further changing the status at the input to the amplifier (base of Q2). Within this closed loop, oscillation will build up at the resonant frequency of the reed as it is only at this frequency that reed output voltage is greatest and driving power needed is at a minimum and the phase relationship between reed drive and output is correct to sustain oscillation.

If it were not for this invention, this oscillation would build up to a point where it would be limited by either amplifier clipping or reed swing, either of which can cause serious distortion.

With this A.G.C. system, however, as the amplitude of oscillation increases, the A.C. voltage across the output of the amplifier (Q3 collector) increases. This A.C. voltage is applied across D1 and since this diode conducts on positive peaks, in this case, it charges capacitor C3 to a positive voltage equivalent to nearly the peak A.C. voltage output.

Since the diode anode is common with the F.E.T. source terminal, this voltage is positive in relation to the source and is applied through filter resistor R2 to the gate of the F.E.T. and is adjusted in amplitude by R3 which forms a voltage divider with R2. C2 is used to maintain the A.C. potential of the source at the gate. The D.C. potential on the gate rises to a more positive value as amplifier output continues to rise until a point at which the conduction of Q1 starts to be reduced by the increased bias on its gate. When the conduction of Q1 is reduced, the A.C. feedback voltage across R6 and to the reed is reduced, thus reducing loop gain. At a point determined largely by voltage divider R2 and R3, an equilibrium will be established between output voltage and loop gain and sustained oscillation of an amplitude within the capabilities of the amplifying device will result.

In the particular amplifier shown, R8 is used to set Q3 collector current and thus collector voltage to one half the applied supply voltage. R4 is chosen for optimum gain and R7 is used to increase Q2 input impedance. R5 allows increased reed swing for a given amount of amplifier output. C5 prevents audio degeneration across R8.

It is recognized that an amplifying device of the PNP type with a negative power supply and a P channel F.E.T. would be equally effective in this circuit.

What is claimed is:

An oscillator comprising, an amplifying element, a field effect transistor having gate, drain and source electrodes, a mechanical vibrating element; said amplifying element, drain electrode, source electrode being coupled serially in a loop for the production of oscillations; said mechanical vibrating element being coupled to said loop to stabilize the frequency of said oscillations; rectifying means, said rectifying means being connected between the source and gate electrodes; said last named means rectifying said oscillations so as to furnish a control voltage for said gate in order to control the transconductance of said field effect transistor so as to stabilize the loop gain.

References Cited

UNITED STATES PATENTS

| | | | |
|---|---|---|---|
| 3,152,307 | 10/1964 | Hensley | 331—116 |
| 3,192,486 | 6/1965 | Faith | 331—116 |
| 3,116,466 | 12/1963 | Grib | 331—116 |

ROY LAKE, *Primary Examiner.*

JOHN KOMINSKI, *Examiner.*